(12) United States Patent
Elfadel et al.

(10) Patent No.: US 8,239,804 B2
(45) Date of Patent: Aug. 7, 2012

(54) METHOD FOR CALCULATING CAPACITANCE GRADIENTS IN VLSI LAYOUTS USING A SHAPE PROCESSING ENGINE

(75) Inventors: Ibrahim M. Elfadel, Cortlandt Manor, NY (US); Lewis William Dewey, III, Wappingers Falls, NY (US); Tarek A. El-Moselhy, Cambridge, MA (US); David J. Widiger, Pflugerville, TX (US); Patrick M. Williams, Salt Point, NY (US)

(73) Assignee: International Business Machines Corporation, Armonk, NY (US)

( * ) Notice: Subject to any disclaimer, the term of this patent is extended or adjusted under 35 U.S.C. 154(b) by 290 days.

(21) Appl. No.: 12/570,418

(22) Filed: Sep. 30, 2009

(65) Prior Publication Data
US 2011/0078642 A1    Mar. 31, 2011

(51) Int. Cl.
*G06F 17/50*    (2006.01)
(52) U.S. Cl. .................. 716/124; 716/119
(58) Field of Classification Search .......... 716/100–101, 716/118–119, 124, 136, 122
See application file for complete search history.

(56) References Cited

U.S. PATENT DOCUMENTS

| | | | |
|---|---|---|---|
| 5,831,870 A | 11/1998 | Folta et al. | |
| 5,838,582 A | 11/1998 | Mehrotra et al. | |
| 5,999,726 A * | 12/1999 | Ho | 716/112 |
| 6,086,238 A | 7/2000 | Mehrotra et al. | |
| 2004/0073877 A1* | 4/2004 | Jones | 716/6 |

OTHER PUBLICATIONS

"Rapid Method to Account for Process Variations in Full-Chip Capacitance Extraction", by A. Labun, IEEE Transactions on Computer-Aided Design of Integrated Circuits and Systems, vol. 23, No. 6, Jun. 2004, pp. 941-951.
"Efficient Algorithm for the Computation of On-chip Capacitance Sensitivities with Respect to a Large Set of Parameters", by T. El-Moselhy, A. Elfadel, D. Widiger, IEEE Xplore, pp. 906-911, Jul. 2008.
U.S. Appl. No. 12/059,163, filed Mar. 31, 2008 titled: Method and System for the Calculation of the Sensitivities of an Electrical Parameter of an Integrated Circuit.

* cited by examiner

*Primary Examiner* — Stacy Whitmore
(74) *Attorney, Agent, or Firm* — H. Daniel Schnurmann

(57) ABSTRACT

Computing the gradients of capacitances in an integrated circuit chip layout with respect to design and process parameters is described. Included is a shape processing engine in the form of a variational mapping engine and a capacitance calculation engine that includes a gradient calculation engine. The variational mapping engine translates physical parameter variations into variations on the edges of the elementary patterns to which the layout of the integrated circuit is decomposed. The gradient calculation engine computes capacitance gradients by combining information from two sources. The first source consists of pre-existing gradients in a capacitance lookup table. The second source consists of analytical expressions of capacitance correction factors.

19 Claims, 15 Drawing Sheets

| TABLE KEY | | | | OUTPUT CAP. | | OUTPUT GRADIENTS | | |
|---|---|---|---|---|---|---|---|---|
| low | cur. | upper. | dist. | $C_1$ | ... $C_N$ | $\dfrac{dC_1}{dP_1}$ | $\dfrac{dC_1}{dP_M}$ | $\dfrac{dC_N}{dP_M}$ |

METHOD FOR CALCULATING CAPACITANCE GRADIENTS IN VLSI LAYOUTS USING A SHAPE PROCESSING ENGINE

TECHNICAL FIELD

The present invention relates generally to the field of design automation of Very Large Scale Integrated circuit chips, and more particularly, to a system and method for extracting data for estimating the capacitance and for verifying and extracting electrical parameters based on geometric layouts.

DESCRIPTION OF THE PRIOR ART

During the course of designing a Very Large Scale Integrated (VLSI) circuit, it is desirable to render some form of circuit characterization in order to determine the performance of the circuit. The characteristic of a VLSI circuit is generally dependent upon two major factors, namely, parasitic capacitance and parasitic resistance. Needless to say, parasitic capacitances associated with interconnect materials within a VLSI circuit can result in unacceptable circuit performances. Hence, it is very important to calculate all the parasitic capacitances within a VLSI circuit in order to determine whether or not they exceed certain design criteria before actual fabrication of the circuit.

Computer-aided design (CAD) tools for parasitic capacitance extraction of a VLSI layout is composed of two main components: a shape processing engine and a capacitance calculation engine. The role of the shape processing engine is to trace the nets of the VLSI layout, followed by decomposing each one of them into elementary patterns whose capacitances are computed using the capacitance calculation engine. The capacitances of the elementary patterns are then assembled into net capacitances which are ultimately passed to a circuit netlist for further processing by other CAD tools, such as timing, power, signal integrity, reliability tools, and the like. The capacitance calculation engine relies on both lookup tables and capacitance formulas for computing the capacitances of the elementary patterns.

The circuit characterization generally begins with a circuit extraction. The circuit extraction software, such as a netlist extractor, is typically utilized to extract various circuits that are required to be simulated, from a VLSI circuit layout. The result of such circuit extraction includes not only the circuitry itself, but also includes the parasitic capacitance and parasitic resistance that are inherent within the interconnect materials. Within the circuit extraction software, there are shape-processing algorithms for detecting and reporting each capacitance event in the VLSI circuit layout.

With the continuous shrinking of feature sizes in current and future semiconductor technologies, the parametric yield due to variations in critical device and interconnect dimensions is expected to decrease. It is therefore important that the parasitic extraction tool be enabled to deal with variations due to process and manufacturing uncertainties. Such variations can be introduced in a nominal extraction CAD flow similar to the one described above either through edge biases computed at run time or through technology files and lookup tables corresponding to the different process corners. When the number of process variables is small, this approach for taking their variations into account in the extraction flow is reasonable and is in line with the traditional multiple corner analysis methodology. However the constant increase in the number of process parameters impacting the shapes of a VLSI layout makes such an approach a methodology bottleneck and a more efficient approach for dealing with variations is needed. One important step is to enable the extraction tool to compute the gradients of the electrical parameter of a given net with respect to the process parameters influencing the shapes of which the said net is composed. These gradients can then be used to build parasitic capacitance (and resistance) models that are valid over full ranges of process parameter variations thus avoiding the need for multiple corner analysis or multiple extraction runs. The two main difficulties encountered in gradient computation are: 1) how to enable the shape processing engine to translate the variations in physical edges into variations in the edges of the elementary patterns into which the shape processing engine decomposes each net in the layout; and 2) how to enable the capacitance calculation engine to combine the gradients of the elementary patterns into a gradient of the parent net while taking into account gradient information provided by the lookup table as well as gradient information computed directly based on the capacitance formulae encoded in the capacitance calculation engine.

As described above, the prior art does not address the problem of including shape variations due to semiconductor process and manufacturing tolerances in the capacitance extraction system and method. Nor does it address, more specifically, the problem of computing capacitance gradients with respect to those shape variations. Another reference where an attempt at computing capacitance gradients is made is "Rapid Method to Account for Process Variations in Full-Chip Capacitance Extraction," by A. Labun, IEEE Transactions on Computer-Aided Design of Integrated Circuits and Systems, Vol. 23, No. 6, June 2004, pp. 941-951. However, the prior art suffers from two main drawbacks:

1) It deals with an extraction flow in which the capacitance calculation engine relies solely on analytical expressions for capacitances. It does not address the more common case when the capacitance information is provided using lookup tables, and
2) It uses a shape processing engine in which the nature of the VLSI layout decomposition is dependent on the type of capacitance one is interested in computing. In other words, the elementary patterns considered change according to whether the capacitance of a targeted primary shape is lateral, fringe, or parallel plate.

Accordingly, there is a need for a system and method that are free of the stated shortcomings and which can be instrumental in significantly improve handling the process variations using extracted gradient information.

SUMMARY

The objects, aspects and advantages of the invention are achieved by a method and a system for computing the gradients of capacitances in a VLSI chip layout with respect to design and process parameters.

The method and system preferably includes a shape processing engine in the form of a variational mapping engine and a capacitance calculation engine that includes a gradient calculation engine. The variational mapping engine translates physical parameter variations into variations on the edges of the elementary patterns into which the layout of the integrated circuit is decomposed. The gradient calculation engine computes capacitance gradients by combining information from pre-existing gradients in a capacitance lookup table and analytical expressions of capacitance correction factors.

In another aspect of the invention, a method and a system are provided for determining capacitance gradients of an integrated circuit chip layout in order to achieve a better performance. The method includes: a) decomposing one or more layout shapes into elementary patterns; b) translating physical parameter variations into variations on parameters of elementary patterns into which the layout shapes are decomposed; c) computing the capacitance gradients of the elementary patterns; d) combining the capacitance gradients into capacitance gradients of one or more layout shapes of the chip layout; and f) transferring capacitance gradient values to a netlist providing electrical-level descriptions of the chip layout.

The gradients are preferably determined from analytical expressions of capacitance correction factors in which the capacitance can be a net-to-net capacitance or lateral, fringing, up and down capacitances for a center shape.

In yet another aspect of the invention, a variational mapping is generated along with an associated data structure from the physical edges of the VLSI layout shapes onto the virtual edges of the elementary patterns into which the shapes are decomposed.

In one embodiment, the invention further provides an additive formula for computing the capacitance gradient associated with a single elementary shape is then provided, and a formula for combining gradients issued from the lookup tables with gradients issued from the parameterized capacitance expressions in the capacitance calculation engine. It is followed by an additive formula for assembling the capacitance gradient of a net from the capacitance gradients of its elementary shapes.

BRIEF DESCRIPTION OF THE DRAWINGS

The accompanying drawings, which are incorporated in and which constitute part of the specification, illustrate the presently preferred embodiments of the invention which, together with the general description given above and the detailed description of the preferred embodiments given below serve to explain the principles of the invention.

FIG. 2b shows how areas are created on the target net of FIG. 2a.

DETAILED DESCRIPTION

The present invention and the various features and advantageous details thereof are explained more fully with reference to the non-limiting embodiments that are illustrated in the accompanying drawings and detailed in the following description of an embodiment of the invention.

Figure 1:
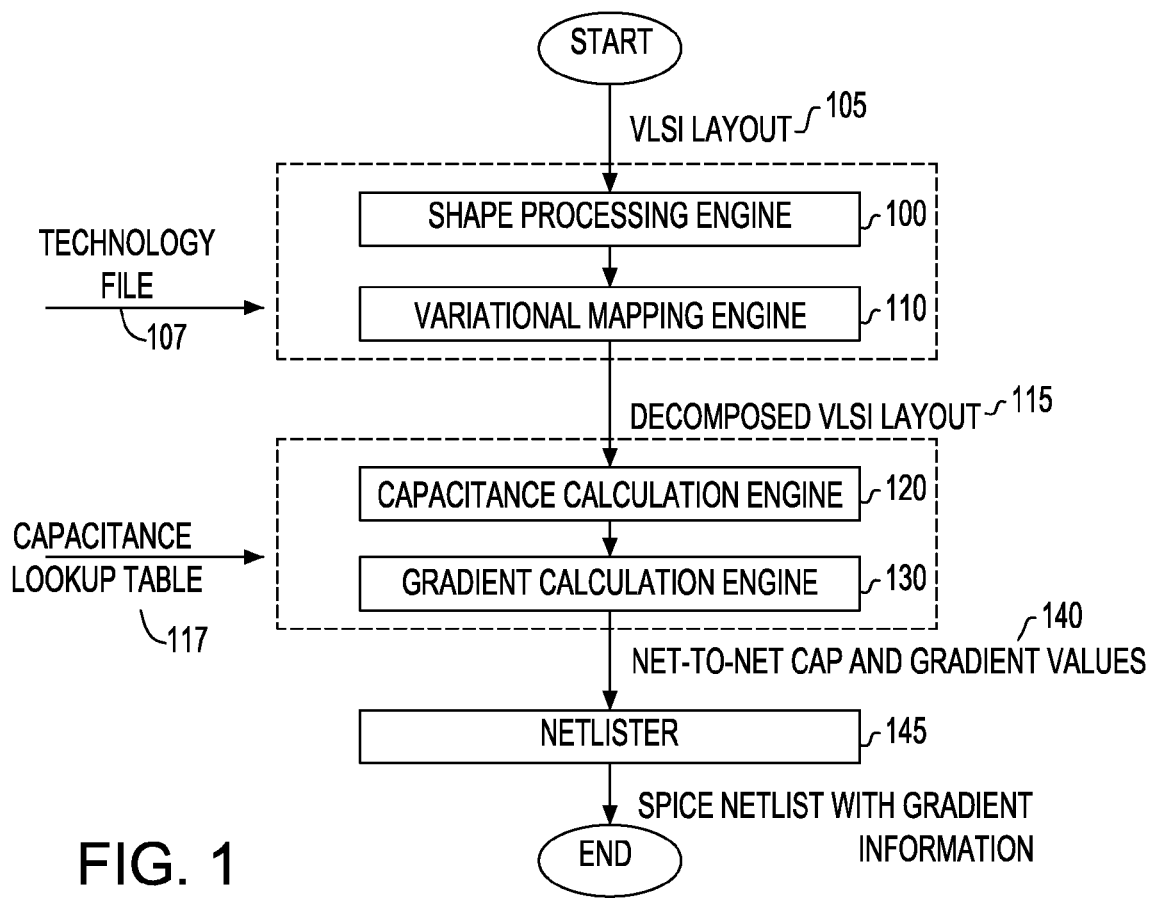
FIG. 1 is a flow chart according to an embodiment of the invention showing how shape processing feeding a variational mapping coupled to gradient computations reflects variations in the shapes of an original VLSI layout.

Referring to FIG. 1, there is shown a flowchart of a preferred embodiment of the invention that corrects the shortcomings found in the prior art and incorporates the calculation of gradients for capacitances based on the shape processing of a VLSI layout.

The flowchart shown in FIG. 1 further illustrates an embodiment of the invention showing a shape processing engine 100 feeding a variational map engine 110 whose role is to reflect variations in the shapes of the original VLSI layout. The input to the system and method is a VLSI layout file 105 describing the shapes of all the devices and wires connecting them on the integrated circuit (IC). These layout files can advantageously make use of industry standard formats, e.g., a format known as GDSII. Another input to the capacitance extraction engine 120 consist a technology file 107 describing various device and wiring layers used in the manufacturing of the IC. Such layer description includes the nature of each layer (diffusion, oxide, poly, via, interconnect) as well as its thickness. In the case of wiring and via layers, the technology file 107 also contains information about the dielectric stack (thicknesses and dielectric constants) used to separate horizontally between wires in each layer as well as vertically between wires in two successive layers. One main usage of the vertical information provided in the technology file 107 is to enable the shape processing engine 100 to ascertain the net continuity in case a given connection spans several wiring layers. Thus, the variations in the shapes of the decomposed VLSI layouts 115 lead to a "divide-and-conquer" method to a VLSI extraction method that applies to nominal values of shape sizes, and which is enabled to work with shape sizes undergoing variations or perturbations due to process and manufacturing tolerances. The variational map engine 110 will be hereinafter described in more detail with reference to FIGS. 5 and 6.

The capacitances of the decomposed VLSI layout 115 are inputted into a capacitance calculation engine 120 driving a gradient calculation engine 130, wherein the gradients of the capacitances of the shapes 130 of the decomposed VLSI layout are computed. The gradients measure the "sensitivities" of shape capacitances with respect to changes in their geometric parameters. The geometric parameters include the horizontal dimensions of the shapes (e.g., length, width) as well as their vertical dimensions (e.g., thickness. The present embodiment thus creates a new net-to-net capacitance augmented by adding thereto the calculated gradient values 140.

The capacitance calculation engine 120 can operate on simpler patterns and compute their capacitances more readily. Another input that eases the burden on the capacitance calculation engine 120 is a capacitance lookup table 117 that contains pre-computed capacitance values for a subset of the elementary patterns that result from the layout decomposition. Other elementary patterns that are not included in the lookup table can obtain their capacitances computed using algorithmic formulas that are programmed within the capacitance calculation engine 120. The coupling capacitance of any pair of neighboring nets in the layout is computed based on the capacitances of the areas (elementary patterns) into which they are decomposed. Although the preferred embodiment of the invention is described using the language of a "target net", it should be understood that it is intended to be only an exemplary illustration and that the method and system of the invention covers the gradient calculation of the coupling capacitance between any pair of neighboring nets in the IC layout.

The final step of the capacitance extraction method consists of passing the net-to-net capacitance values 140 to a netlisting program 145 which produces an electrical-level description of the devices and wires connecting them. This description is typically used either in a circuit simulation program such as SPICE, well known in the art, that outputs a SPICE netlist 150 used for the accurate electrical analysis of the layout or in other computer-aided design programs such as programs for timing, signal integrity and power analysis of the IC, but which incorporates therein the necessary gradient information.

Figure 13:
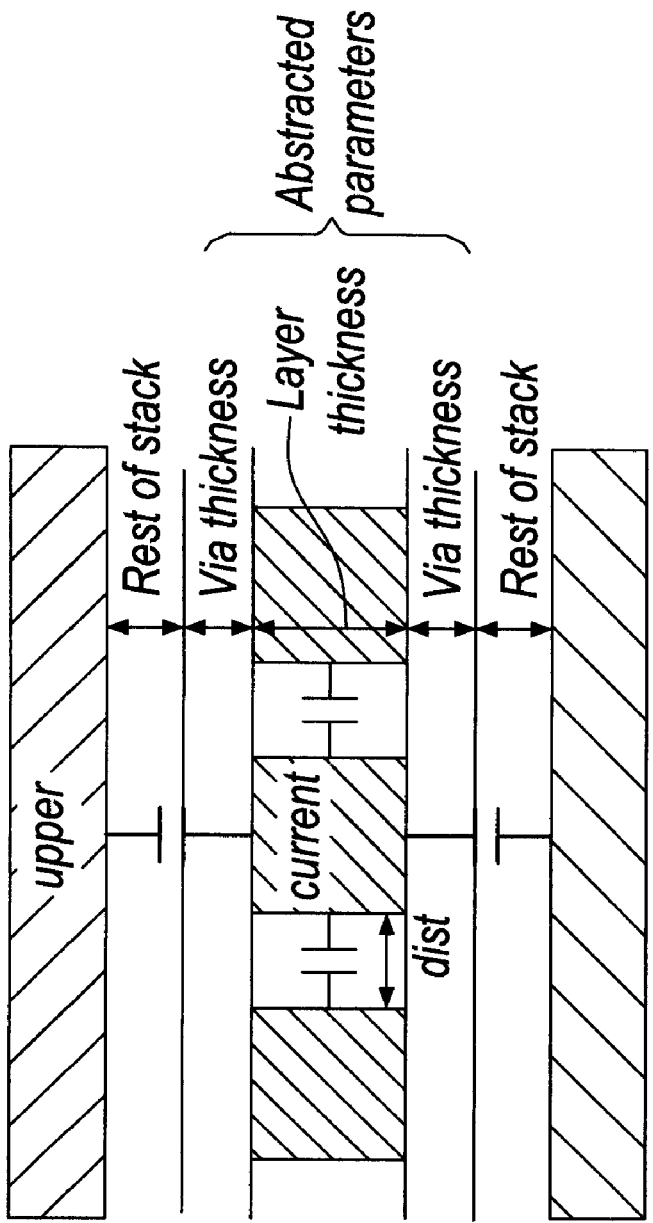
FIG. 13 illustrates a gradient aware lookup table which includes gradient information of elementary patterns in line with the parameter abstraction of FIG. 7.
Figure 14:
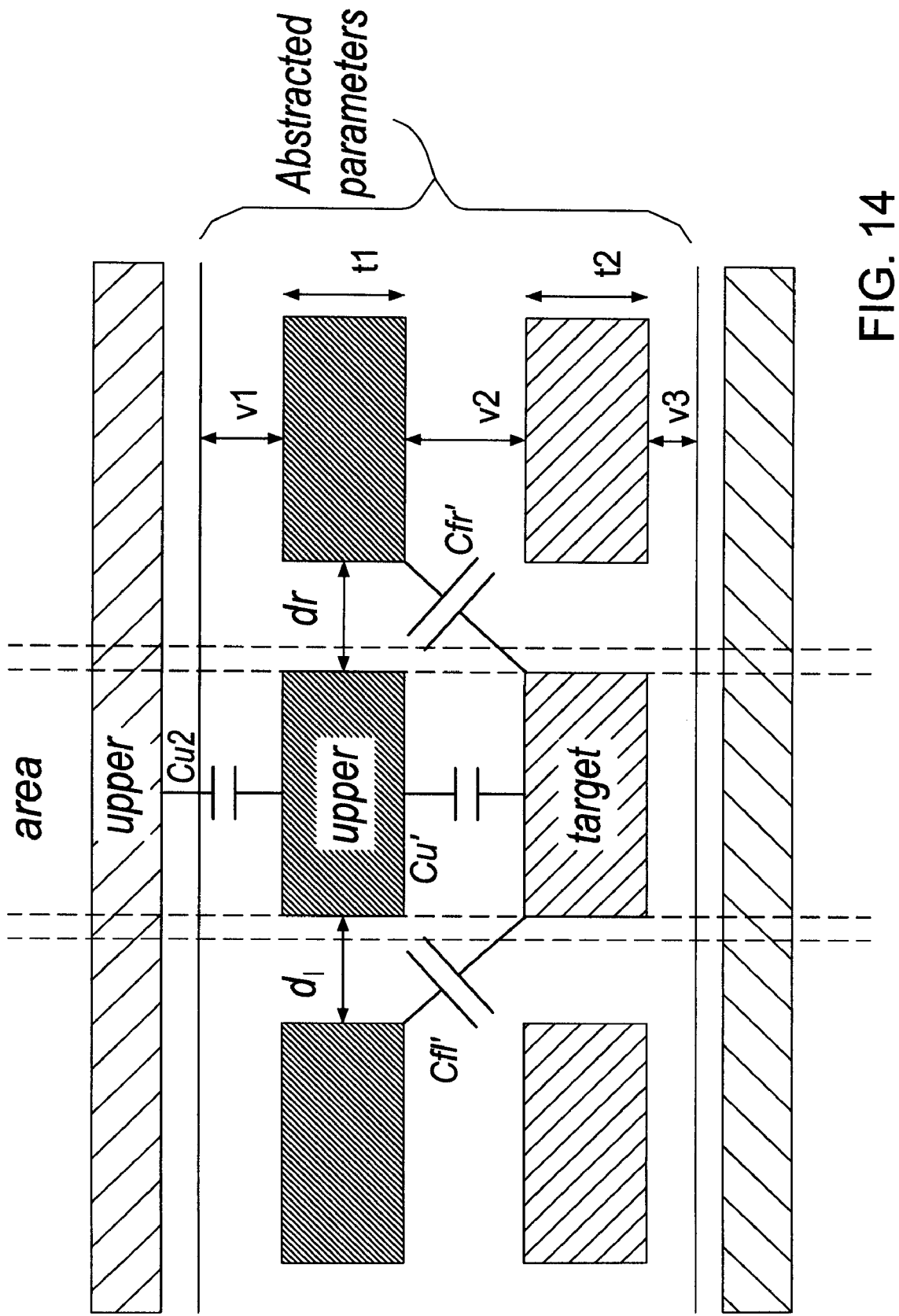
FIG. 14 is an illustration of a horizontal splitting algorithm used in the capacitance gradient computation.
Figure 15:
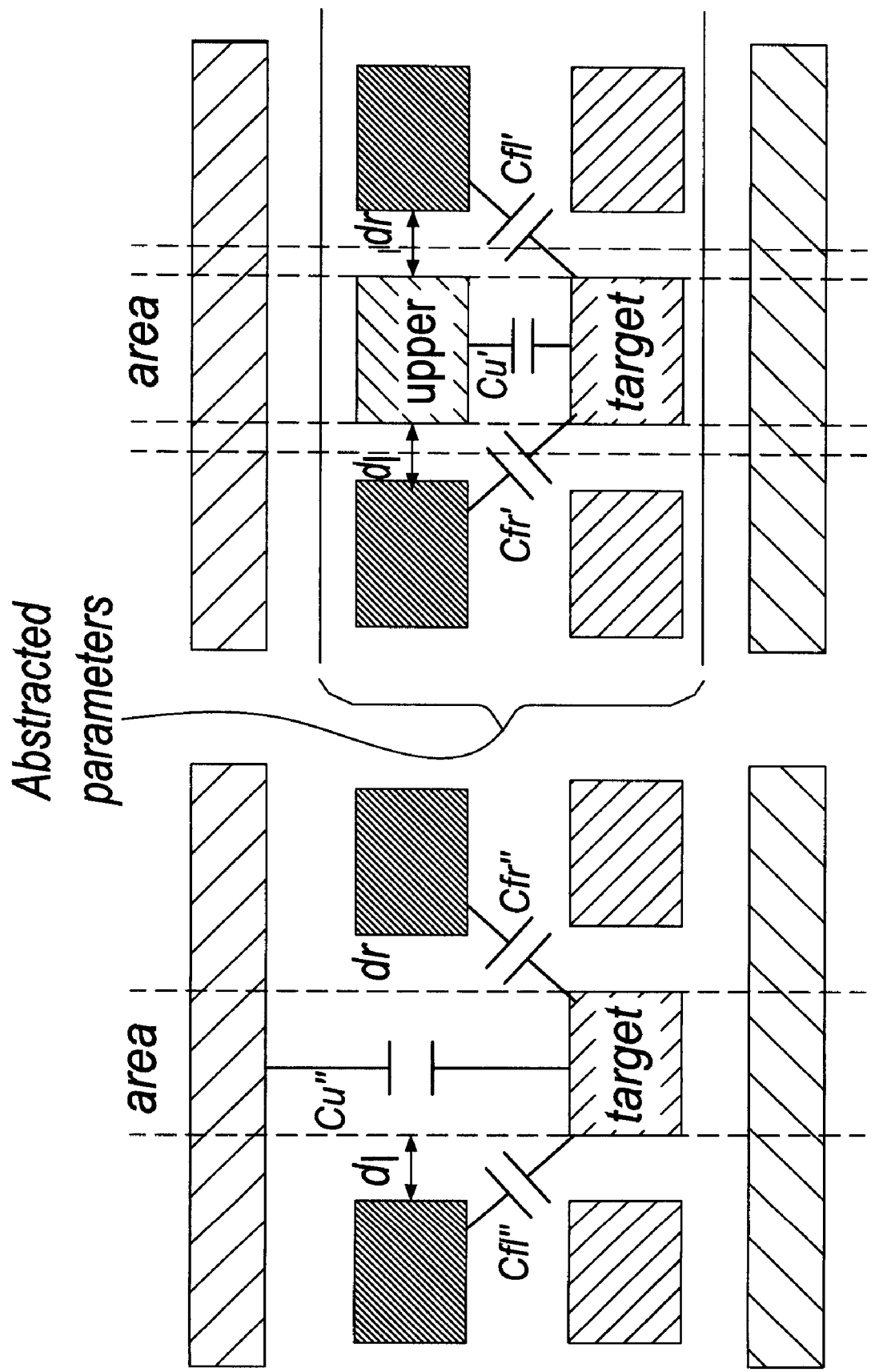
FIG. 15 is an illustration of a ghost wire and the vertical splitting algorithm for capacitance gradient computation.

As it will become clearer from the detailed description of subsequent figures, modifications are made so that it is compatible with the calculation of capacitances for shape patterns existing in the lookup tables as well as shape patterns not covered in the lookup tables (FIGS. 13 through 15).

Figure 2A:
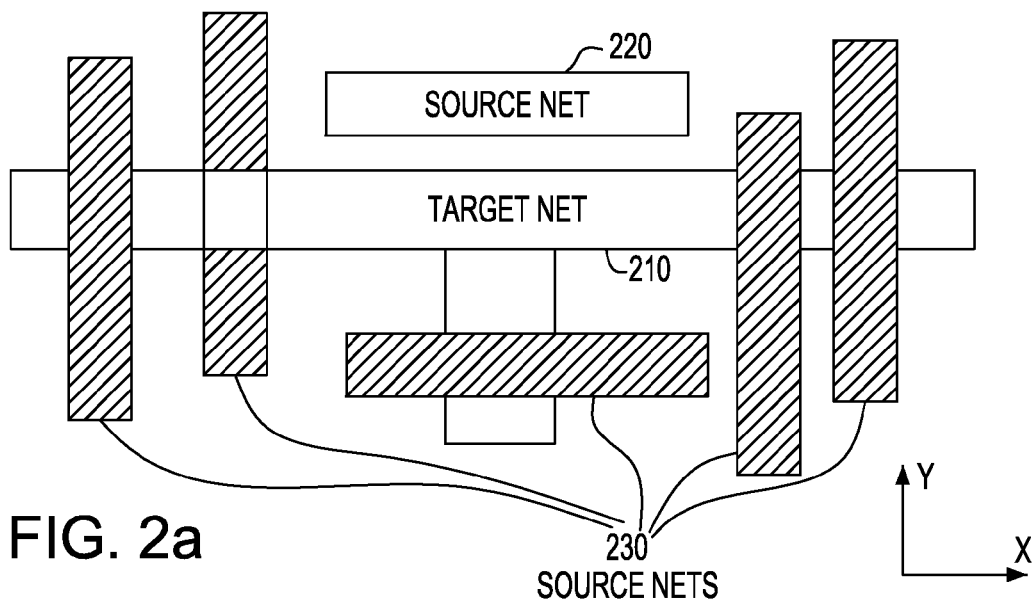
FIG. 2a illustrates an example of a target net surrounded by various source nets.

In FIG. 2a, the terms source and target nets are used to describe the preferred embodiment of the present invention, in which target net-to-net capacitance 210 is determined. The capacitance is the sum of contributions from a set of source nets 230 in the vicinity of the target net 210. The target and source nets typically span several conducting layers of the VLSI chip. Some source nets 230 may lie in the same layers as the target net 210 while others (with fill patterns) may lie in other layers than the target net. These other layers can be either above 220 or below 230 the target net.

Figure 2B:
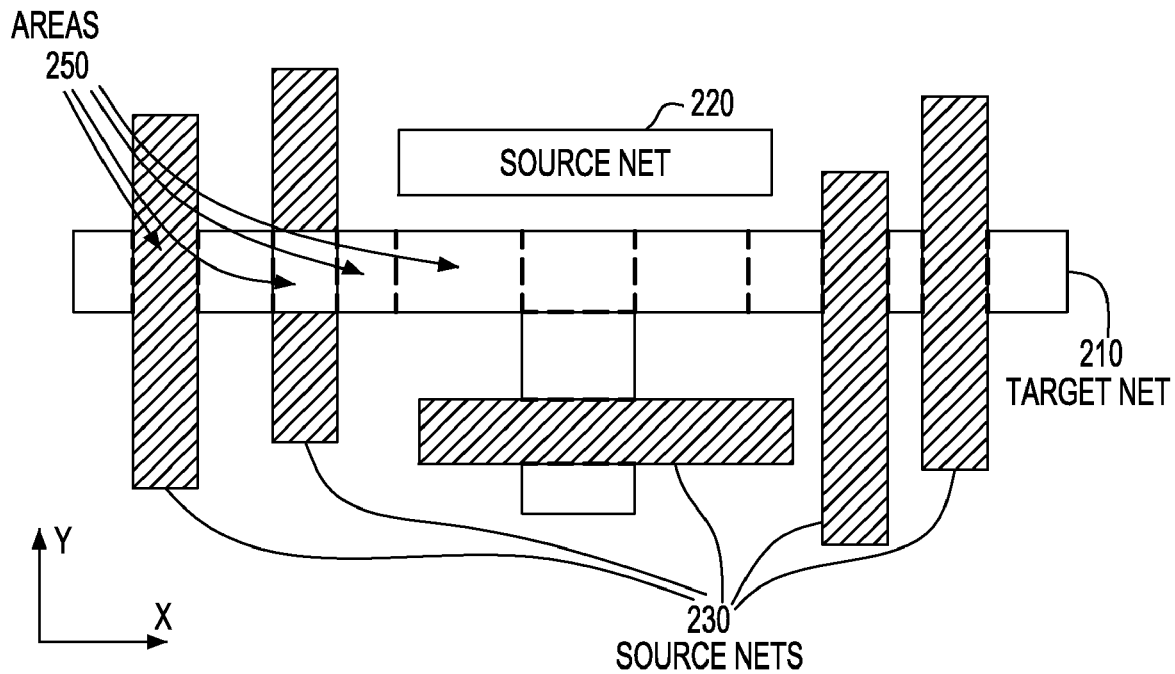

As previously mentioned, the original shapes of the VLSI layout are first decomposed into a union of simpler shape patterns. FIG. 2b is an example of the principle of such decomposition using physical edges of the target net and neighboring source nets. Each physical edge of a selected source net shape, e.g., 220, results in a virtual edge on the target net shape. Virtual edges and physical edges on the target net 210 combine to delimit rectangular regions known as areas 250. It is worth noting that in reference of the target net shape 210, some areas result in a metal overlap between the target and source nets 230, while other areas display no such overlap.

Figure 2C:
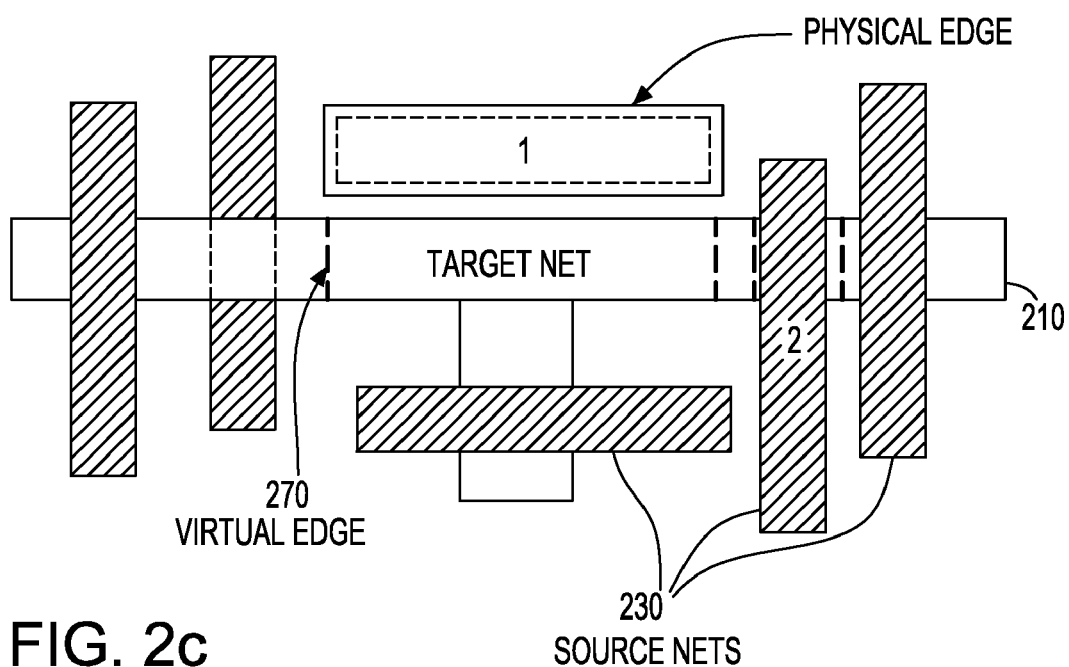
FIG. 2c is an illustrative example of a virtual edge as contrasted with a physical edge that determines the impact of shape variations of area virtual edges.

In FIG. 2c, an example of shape modification or variation is provided along with its impact on the placement of virtual edges 270. Shown are two source net shapes 230 expanded in size (both in length and width) with the results that the virtual edges that they project onto the target net shape are displaced. The figure illustrates the displacement of virtual edges due to displacement physical edges in source nets. The physical edges of the target net areas 280 may also incur in a displacement due to design and manufacturing tolerances in the physical edges of the target net itself.

Figure 2D:
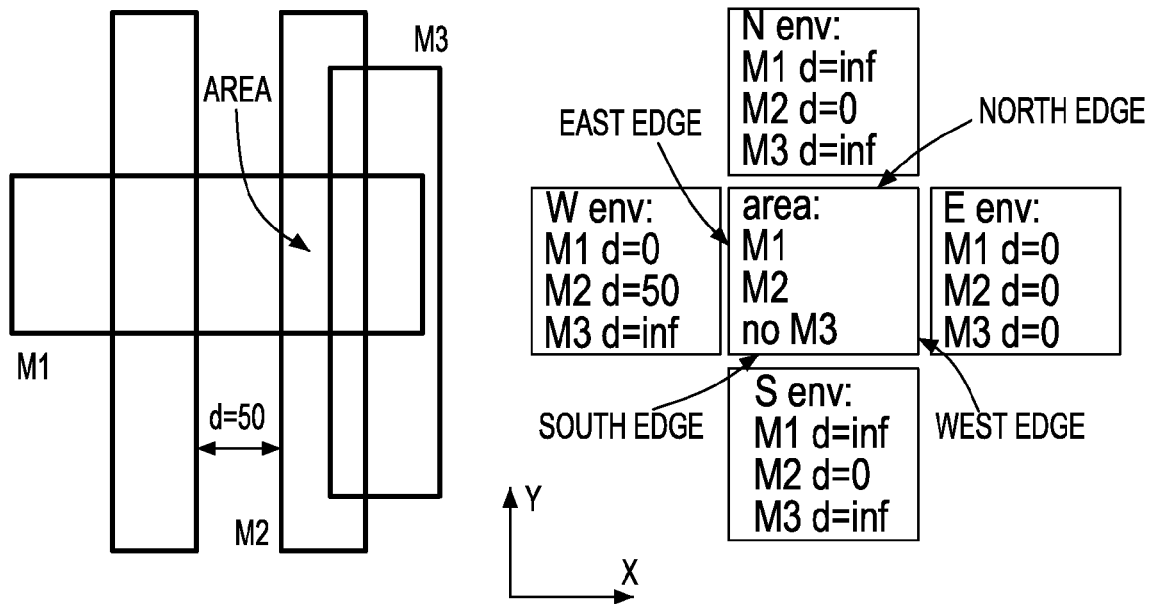
FIG. 2d is an illustrative example of an area delimited on a target net shape along with an accompanying data structure derived from the area geometric information.

FIG. 2d is yet another illustration of the area delimited on a target net shape accompanied with the data structure used to represent the area in a computer program. The data structure is defined in reference to the area's own composition as well as in reference to the shapes that are in its immediate vicinity. Under the assumption that the VLSI chip layout uses three metal layers, the area illustrated in FIG. 2d is composed of the overlap shapes in layers M1 and M2 with no shape from layer M3. Furthermore, the four edges of the area (virtual of physical) are related to neighboring shapes with the edge-to-edge distances shown as North (N), South (S), East (E) and West (W) edges of the area. For instance, referring to layer M1, the area has a distance 0 to the portion of the target net on layer M1, while on layer M2, it has a distance d of 50. Referring to layer M3, it has a distance of infinity, meaning that there is no shape on layer M3 to the west of the area in question.

FIGS. 3a through 3e are further illustrations of how the areas on a target net M1 are modified as the shape of the net is traced from left to right, each having the horizontal 2D projection on the left and the vertical elevation on the right. In both left and right portions of each figure, the area in question is provided by the rectangle with the filled pattern. The vertical dashed lines are used to emphasize the fact that the edges from the area often (but not always) result from the projection of the physical edges of the shapes below or above the target shape. Still referring to FIG. 3a, using the shape on layer M1 as a target net, there is shown how the edges of the shape on layer M2 project to define the virtual edges on the shape M1, defining an area resulting from the overlap of one shape from layer M1 with one shape from layer M2.

Figure 3A:
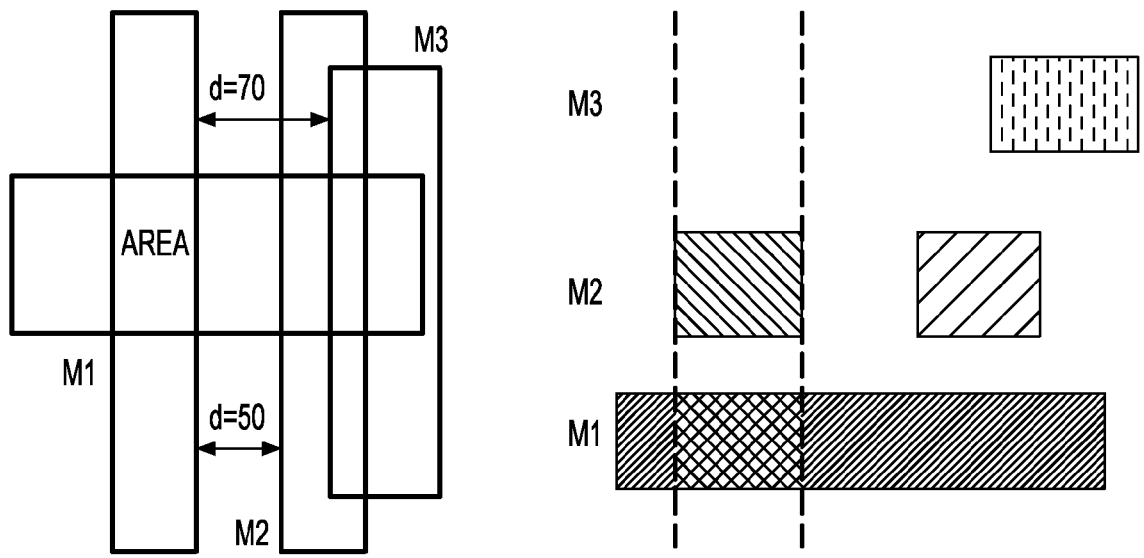
FIG. 3a through 3e depicts various examples of the areas on a target net relative to the shapes that are present below and above the target nets.
Figure 3B:
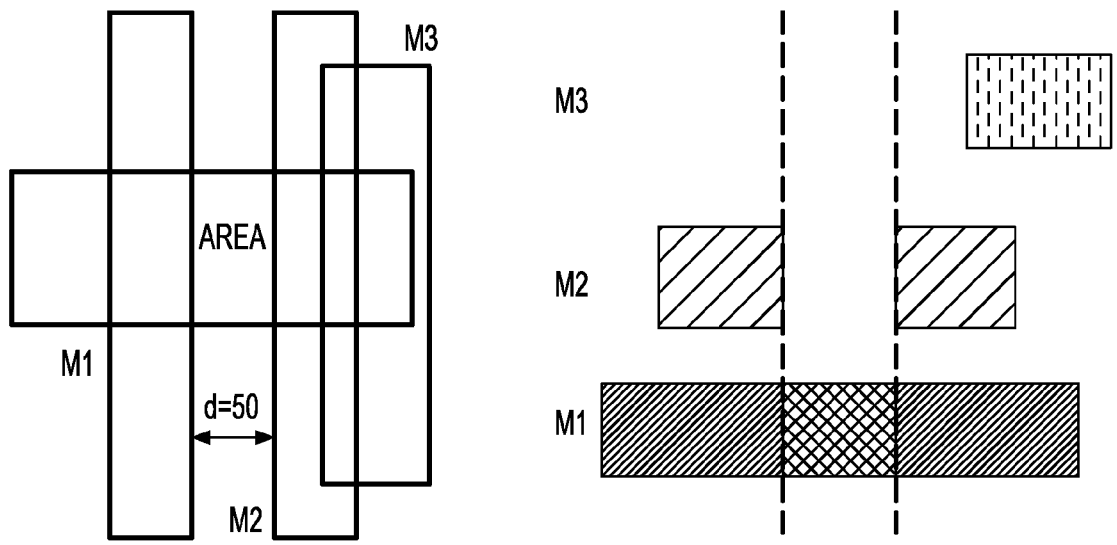

FIG. 3b shows yet another area on the target net, but the area is provided with virtual edges from physical edges projected by two different though neighboring shapes on layer M2. As a result, the area on FIG. 3b has no shape overlapping the shape on layer M1.

Figure 3C:
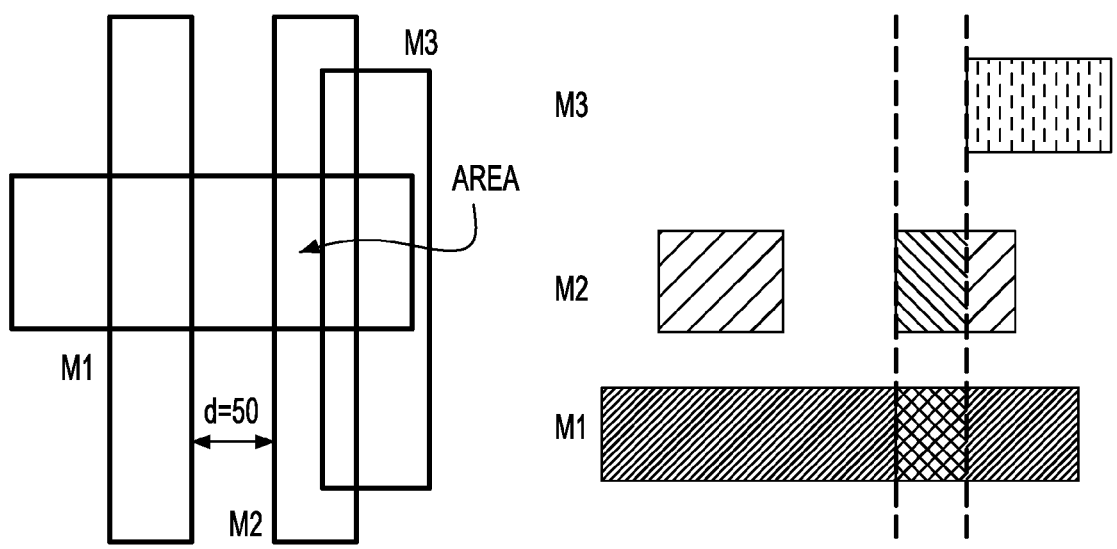

FIG. 3c illustrates a virtual edge on a target net area coming from a physical edge in two or more layers above or below the target net. Indeed, the right virtual edge on the target net results from the left physical edge of the shape on layer M3 whereas the left virtual edge results from the shape on layer M2.

Figure 3D:
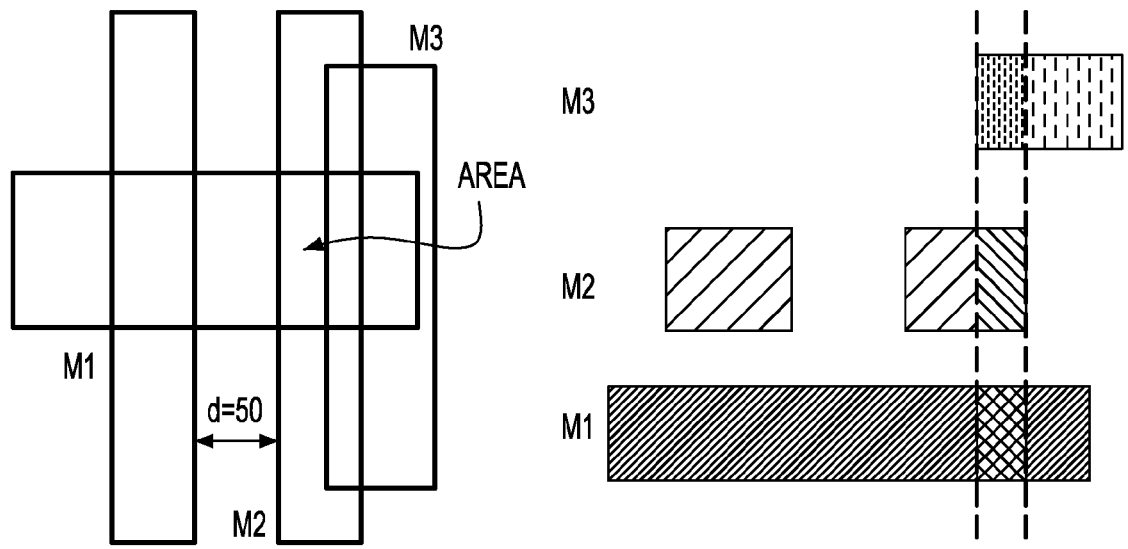
Figure 3E:
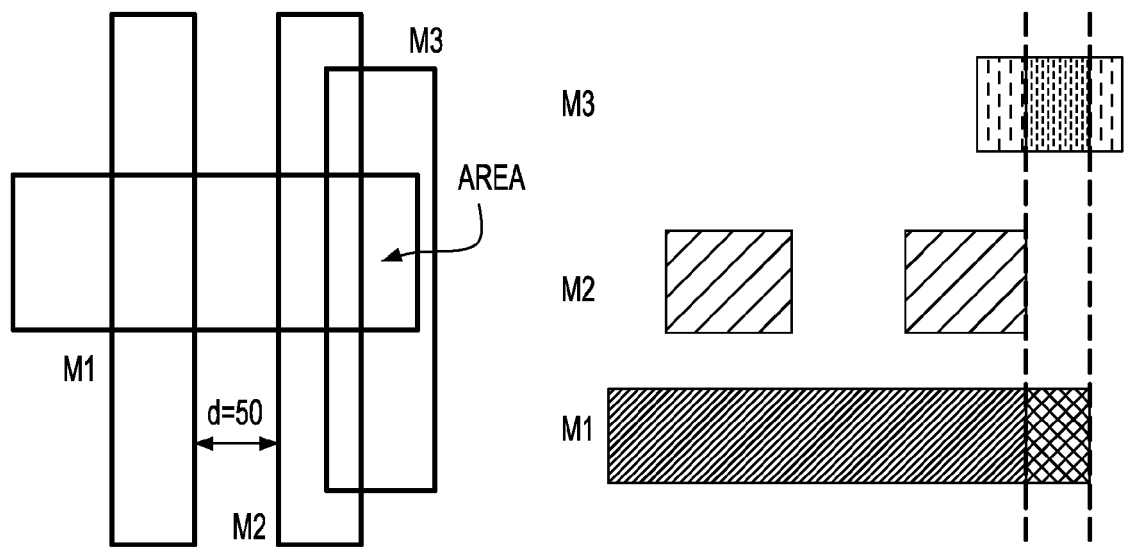

FIG. 3d shows the target net area having three shapes overlapping on layers M1, M2 and M3. Finally, FIG. 2e shows that the last area on the target net is made of the left virtual edge projected from the shape on layer M2 and the physical edge of the target net itself The last area has shapes from layers M1 and M3 overlapping, but no shapes overlap from layer M2.

Figures 4A, 4B:
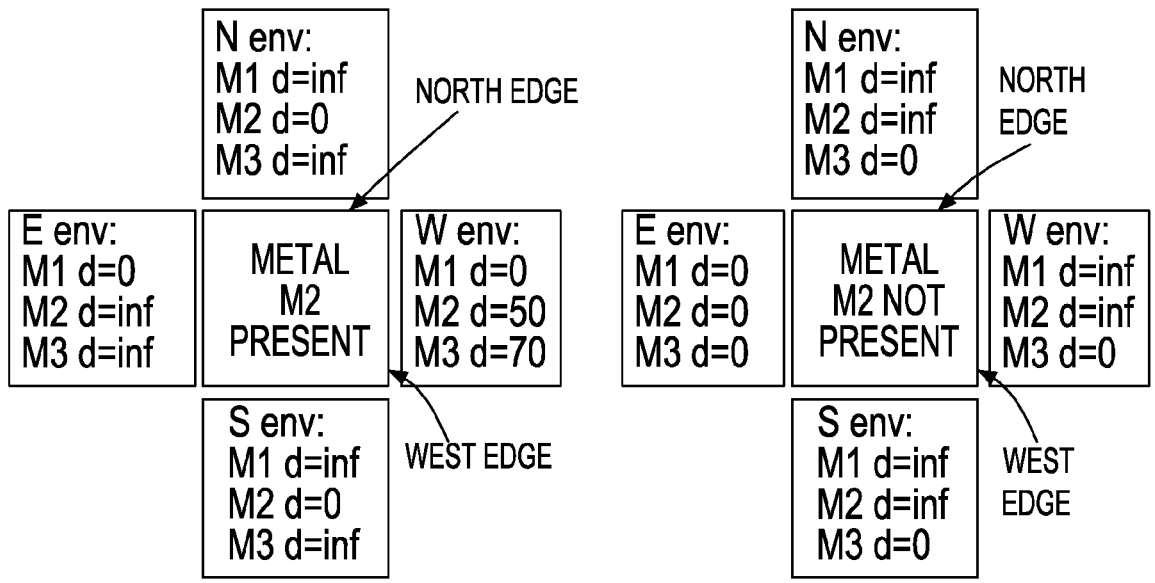
FIG. 4 illustrates how the area data structure changes from one layer to another.

FIGS. 4a and 4b contrast the contents of the data structure defined in FIG. 3d for two of the cases described in FIG. 3a through 3e. The contrast is defined in terms of the neighboring content in the instance where an area shape on M2 is present vs. a case where an area shape on M2 is absent. The left data structure refers to the case illustrated in FIG. 3a, while the right data structure refers to the one shown in FIG. 3e. Taking as reference the shape at the center of the left section (FIG. 4a), its north edge is immediately adjacent to the continuation of the overlapping shape on layer M2, and in the north square it is referred to by the expression "M2 d=0". On the other hand, the north edge has no shapes on layers M1 or M3 adjacent thereto (FIG. 4a), which is indicated by the expressions "M1 d=inf" and "M3 d=inf", and which translates the absence of a shape into assigning an infinite distance between some hypothetical shape and the edge in question. Referring now to the west edge, it is adjacent to a shape on layer M1, i.e., the continuation of the target net on M1, and which is referenced by "M1 d=0" within the western square. It also has neighboring shapes on layers M2 and M3, at distances 50 and 70, respectively. These are represented by the expressions "M2 d=50" and "M3 d=70" in the western square. The remaining edges of the central shape as well as all the edges of the central shape in the right figure (FIG. 4b) can be related to their neighbors in a similar manner.

Figure 5:
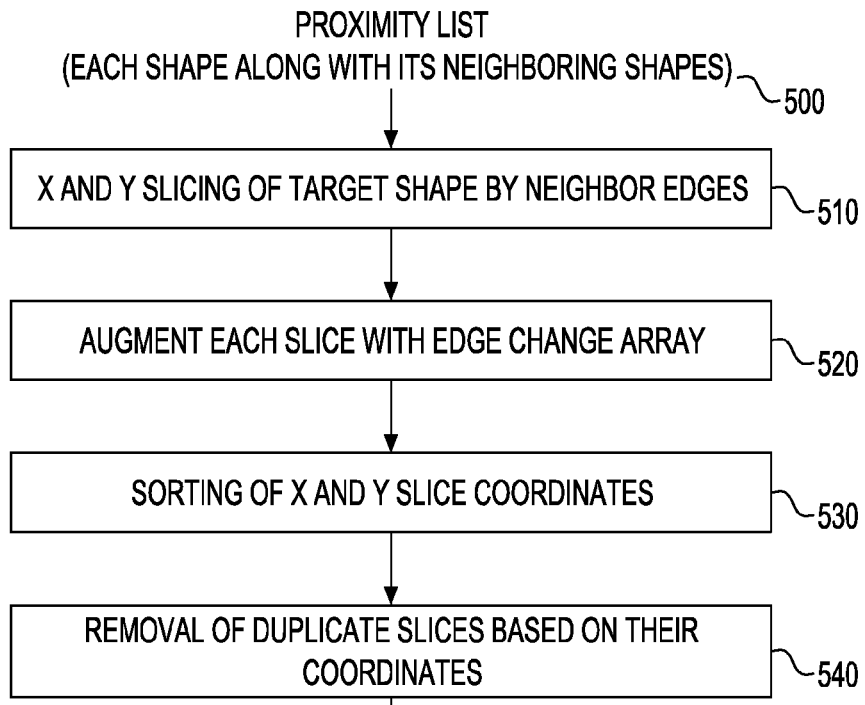
FIGS. 5 and 6 represent flowcharts of a variational map used in the shape processing engine to assign variation coefficients to virtual edges based on variations of physical edges.

FIG. 5 is a flowchart of the variational mapping engine that transforms variations on the physical edges of shapes into variations on the virtual edges of areas. The variational mapping engine takes as input the proximity map of the nets in the VLSI layout 500. The proximity map is made of all the nets in the VLSI layout along with the shapes that are in the proximity of each net. The proximity is defined by a maximum distance between shapes and results in including in the proximity map shapes that are separated by less than the predefined maximum distance. It is worth noting that members of the proximity list of a given target net includes not only shapes on the same layer of the net, but also shapes that are in layers below or above the target net. The first step in the variational mapping uses edges of the proximity shapes 510 to project virtual edges on the target shape 520. Using a global orientation of the horizontal plane, the virtual edges (also referred to as slices) can be oriented in either the X direction or the Y direction. The second step 520 in the variational mapping is to augment each slice resulting from the first step with what is referenced to according to one preferred embodiment of the invention, as an edge change array. Each of such arrays preferably consists of three components. The first component quantifies the impact of changes in the physical edges of the target shape itself. The second component quantifies the impact of changes in the physical edges of the shapes immediately below the target shape. The third component quantifies the impact of changes in the physical edges of the shapes immediately above the target shape. The restriction to three components is not limiting, and one skilled in the art will appreciate that the size of the change array may be increased to include the impact of the changes for shapes that more than one layer below or above the target shape. One main reason for limiting the size to three is to curtail the memory footprint of the variational map. The values assigned to each component of the change array are defined with reference to a global orientation system in the horizontal plane of the target shape.

Referring now to the X axis of the orientation system, the East-West edge variations are defined. With reference to the Y axis of the orientation system, North-South edge variations are defined, whereas for an X-oriented edge (or slice), a Western edge motion is assigned the value of −1. The absence of motion is assigned the value 0, and an Eastern edge motion is assigned the value of +1. Similarly, for a Y-oriented edge (or slice), a Southern edge motion is assigned the value of −1, the absence of motion is assigned the value 0, and a Northern edge motion s assigned the value of +1. The third step in the variational mapping algorithm is to sort coordinates of the X-oriented edges and the Y-oriented edges 530. It may occur that two or more edges have the same coordinate. In this case, the algorithm declares an edge duplication and removes the duplicates from the sorted list 540. A person skilled in the art will appreciate that removal of duplicates can be refined to reduce the error in the capacitance gradient calculation that may result from removing the duplicate edge that has an edge change array different from the edge that is kept in the sorted list.

Figure 6:
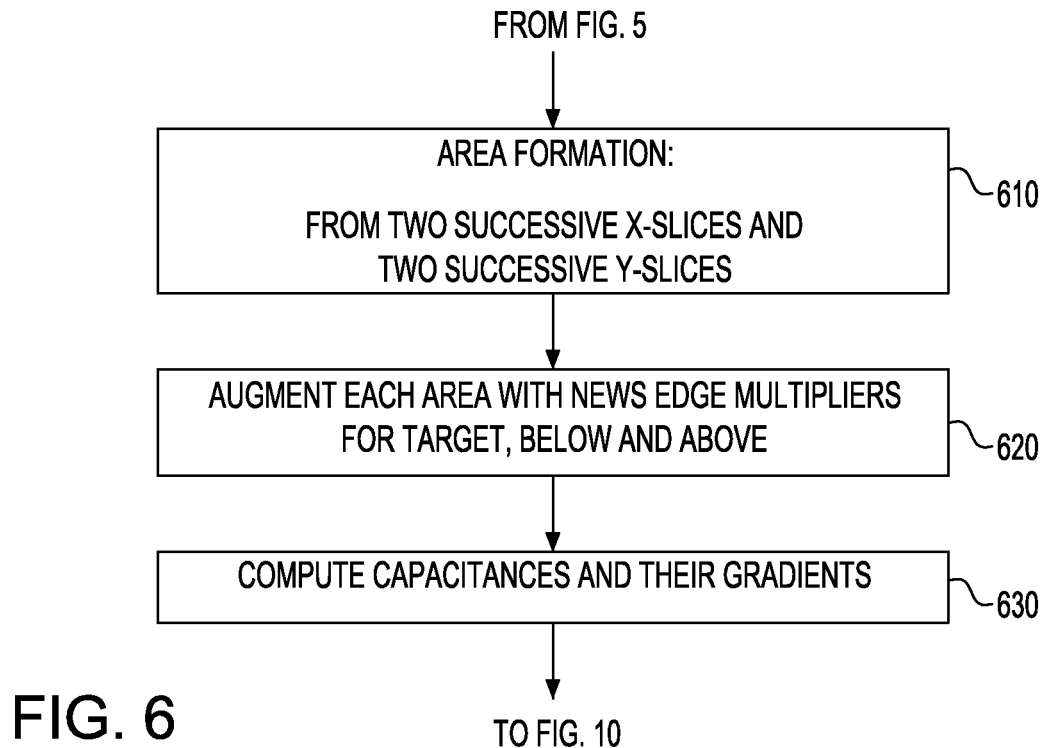

FIG. 6 is a continuation of FIG. 5 whereby the X-edge sorted list and the Y-edge sorted list are used to form the areas of the target net. As noted in the description of FIG. 3, an area is bounded by two X-edges and two Y-edges. Using the sorted X-edge and Y-edge lists, any pair of two successive X coordinates in the X list defines the X-edges and any pair of two successive Y coordinates in the Y list defines the Y-edges of an area 610. The X-edges and Y-edges of the area define the NEWS neighborhood data structure of FIGS. 2d and 4. Each of these edges has its own edge change array. The impact of the edge change array on capacitance gradient calculation is accomplished using edge multipliers 620. The edge multiplier is defined according to the following rules:

West and South edges that are assigned an edge change value of −1 (reps. +1) are assigned a multiplier of +0.5 (resp. −0.5).

East and North edges that are assigned an edge change value of −1 (resp. +1) are assigned a multiplier of −0.5 (resp. +0.5).

An edge change value of 0 always results in a multiplier of 0.

The reason for selecting 0.5 as the absolute value of the multiplier when there is an edge change is based on the assumption that when the width of the shape is changed by an absolute value of +1, the edges of the shape move symmetrically with respect to the shape medial axis by a value of 0.5. This aspect of an embodiment of the invention will be explained further with reference to FIGS. 7 through 9. Each area, thus formed and augmented with edge multiplier, is then processed in the calculation engine that computes capacitances and gradients 630. These aspects of the invention will be described further in reference to FIGS. 10 through 17.

Practitioners in the art will appreciate that if the shape dimensions were allowed to change independently, the number of parameters that have to be taken into account in the variational analysis would become unwieldy.

Figure 7:
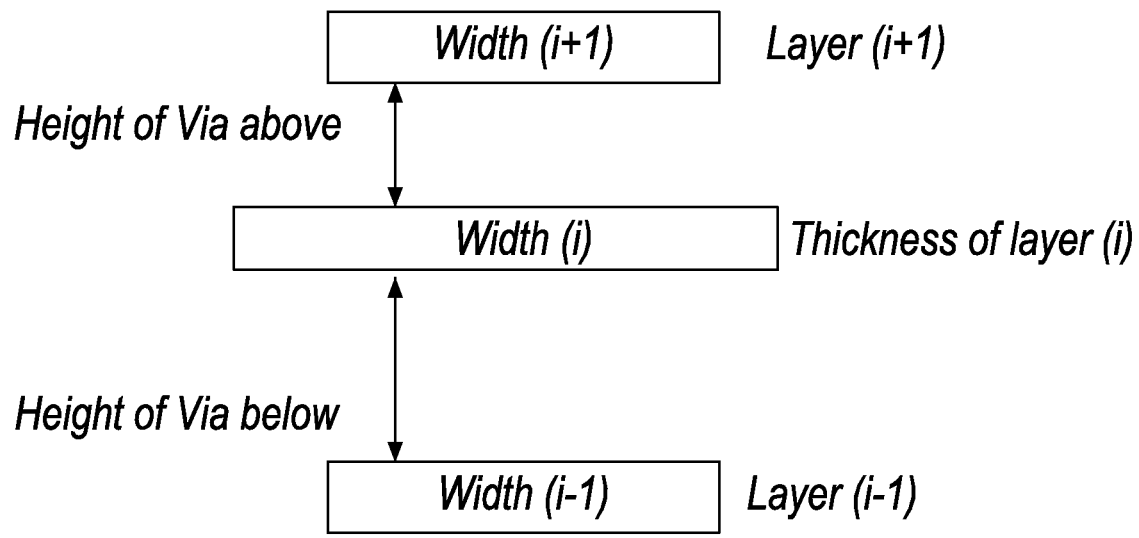
FIG. 7 is a representation of the parameter abstraction used in one preferred embodiment of the present invention.

Referring to FIG. 7, the parameter abstraction used to control the number of parameters with respect to which capacitance variations are computed. Assuming for illustrative purposes that the target net pertains to layer i, then rather than varying the widths of the shapes in layer i independently, it is assumed that they all vary in lockstep so that only one width parameter w(i) is assigned to layer i. Similarly, it is assumed that the layers immediately below (i−1) and immediately above (i+1) the target net are each assigned one width parameter, w(i−1) and w(i+1), respectively. Therefore, uniform width variations of the target layer, the layer immediately below and the layer immediately above represent abstractions of all the horizontal width variations that impact the capacitance of the target net. It is worth noting that length variations are also abstracted as are the width variations, and thus, are included in the variational mapping. Similarly, while two conducing shapes on a given layer may have different thicknesses due to chemical and mechanical polishing, it assumed that all shapes on layer i have their thickness change in lockstep so that only one thickness parameter is assigned to layer i. Capacitances are also dependent not only on the shape separation within a given layer but also on the vertical separation between layers. The via layers below and above the target layer may have their heights depending locally on conditions of metallization or etching during the semiconductor fabrication. Yet, to keep the parameter set in a manageable size, it is assumed that local height variations are advantageously abstracted in two via height variations, one for the via height below and one for the via height above. Thus, target layer thickness, via height below and via height above the target layer are the only vertical parameters considered in the calculation of capacitance gradients. In total, for each target net, the number of parameters with respect to which capacitance gradients are computed is six parameters, three horizontal and three vertical. It should be apparent to a person skilled in the art that these parameters are preferably the ones that most influence the value of the target net capacitance. Moreover, since the horizontal parameters are all widths, a convention must be adopted as to how the width variation translates into an edge variation. For illustrative purposes, the convention that is adopted in one embodiment of the invention is that the width variation induces symmetric edge variations with respect to the medial axis of the shape. Other conventions are also possible, including ones in which edge variation is modulated by the proximity of other shapes thereto.

Figure 8:
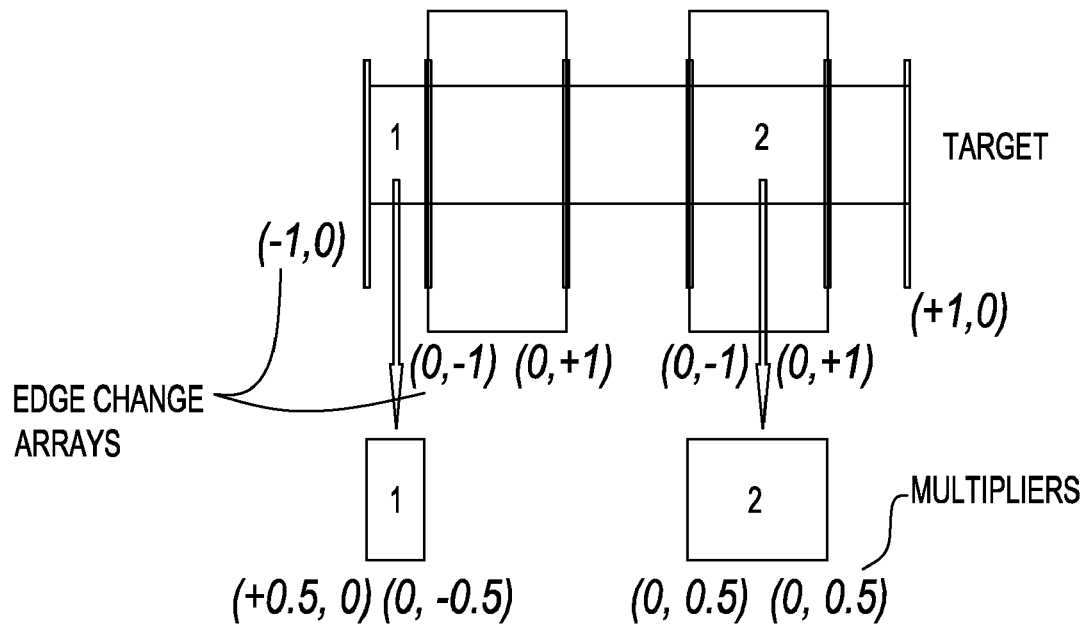
FIG. 8 is an example of the variational mapping from the physical edges to the virtual edges in light of the parameter abstraction of FIG. 7.

FIG. 8 is an example showing how to assign edge change arrays and multipliers in the simple case where the target shape is crossed by two other shapes in the Y orientation. Consequently, only Y-oriented shapes are shown. The leftmost edge of the target wire becomes the Western edge of area 1. Its edge change array is (−1,0) because wire length increase results in moving the edge in the negative direction with respect to the global X axis and because the crossing shapes have no impact whatsoever on the edge. Its multiplier array as the Western edge of the area 1 is calculated per the rules given above. The Y-oriented edges of area 2, on the other hand, are all due to the physical edges of the crossing shapes. Their change values are (0,−1) and (0,+1) because any increase in crossing shape width results in moving the Western edge in the negative direction and the Eastern edge in the positive direction. On other hand, variations in the target shape have no impact whatsoever on the Y-oriented edges of area 2. The multipliers assigned to these edges are according to the rules defined above. An important aspect of the present invention as illustrated in the present example is that it takes into account length variations causing an impact when the length changes into edge change array values, and subsequently into multipliers.

Figure 9:
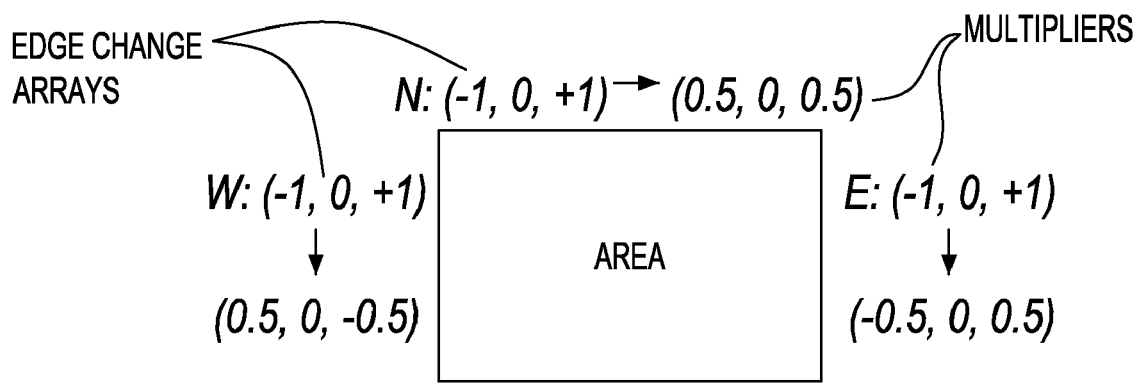
FIG. 9 is a further illustration of the variational map and the method of assigning multipliers to the virtual edges of an area.

FIG. 9 is yet another example of how to derive multiplier values using the multiplier rules described with reference to FIG. 5. It is worth noting that the value of the multiplier is the result of the nature of the edge (N, S, E, W) as well as the values of the change array assigned to the edge.

Once an area list for the target net has been obtained, each area along with its NEWS neighborhood data structure is processed by the capacitance and gradient calculation engine. Details of such processing are described with reference to FIGS. 10, 11, and 12.

Figure 10:
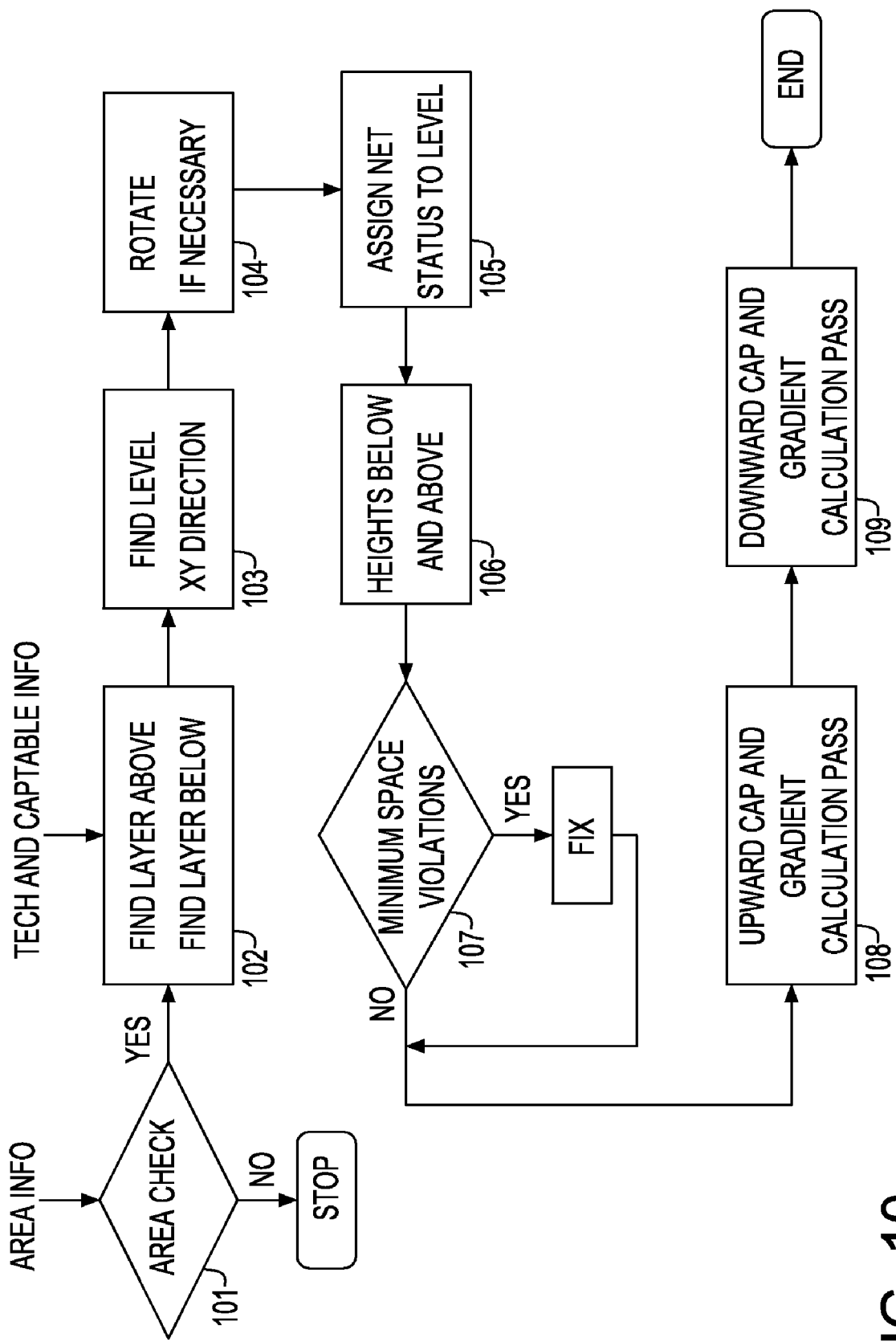
FIG. 10 is a flowchart showing the capacitance and gradient calculation engine.

FIG. 10 is a flowchart of the various preliminary checks, verifications, and validations that are advantageously conducted on each area before initiating the capacitance and gradient calculation on the area geometric configuration. These preliminary operations include finding the top and bottom occupied levels in the area stack (10.2) and finding the X,Y orientation of each level in the area stack (10.3). Jogs and corners may lead to some shapes taking a direction different from the global orientation of the layer. Also, virtual edges may result in areas that are oriented differently than the global orientation of the layer in which they lie. Thus, a rotation operation (10.4) is sometimes required. Shapes in the area stack may belong to nets with special status. An example of such nets are those of the power grid. Net status should be passed to the shapes in the area stack (10.5). Furthermore, since in a VLSI chip layout, only horizontal distances are provided, the technology information should be accessed to obtain vertical distances. This is accomplished in (10.6). Regarding the horizontal distances, a "minimum space violations" check (10.7) is conducted, whereby the spacing between any two shapes on the same layer for the area and its neighbors is checked to ascertain that it is above the minimum spacing required. Minimum spacing requirements are provided in the technology file. One preferred embodiment provides automatic fixes to the spacing violations so as not interrupt the capacitance and gradient calculation. In another embodiment, violations are reported back to the user who may provide these fixes manually by changing the VLSI chip layout. The capacitance and gradient calculation (10.8, 10.9) are conducted as soon as all the above checks, validations, and verifications have been completed. Because a given area of a target net contains in its data structure shapes that belong to layers both above and below the target shape, the actual capacitance calculation is split between an upward pass (10.8) and a downward pass (10.9).

Figure 11:
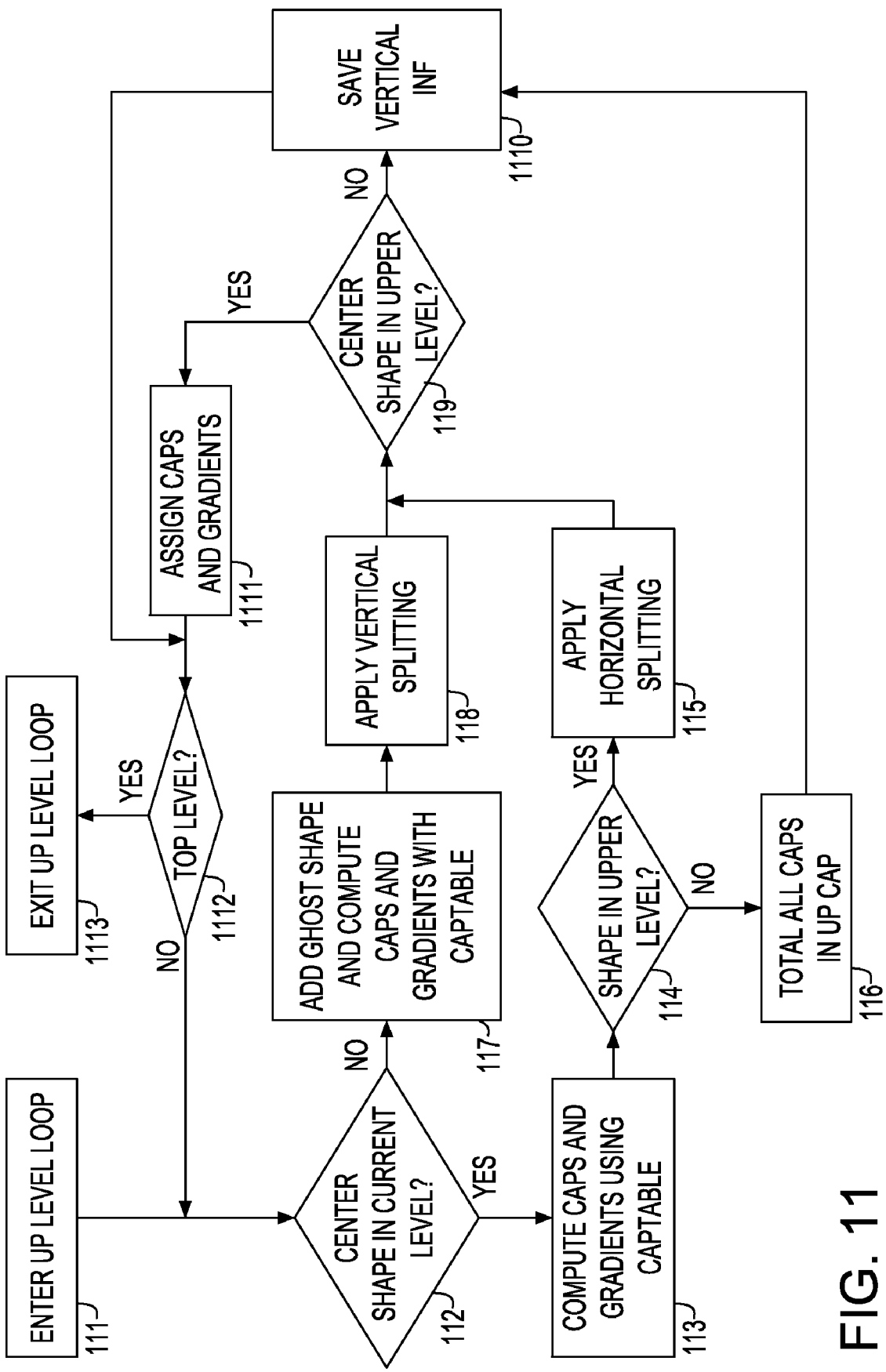
FIG. 11 is a flowchart showing the upward pass in the capacitance and gradient calculation engine.
Figure 12:
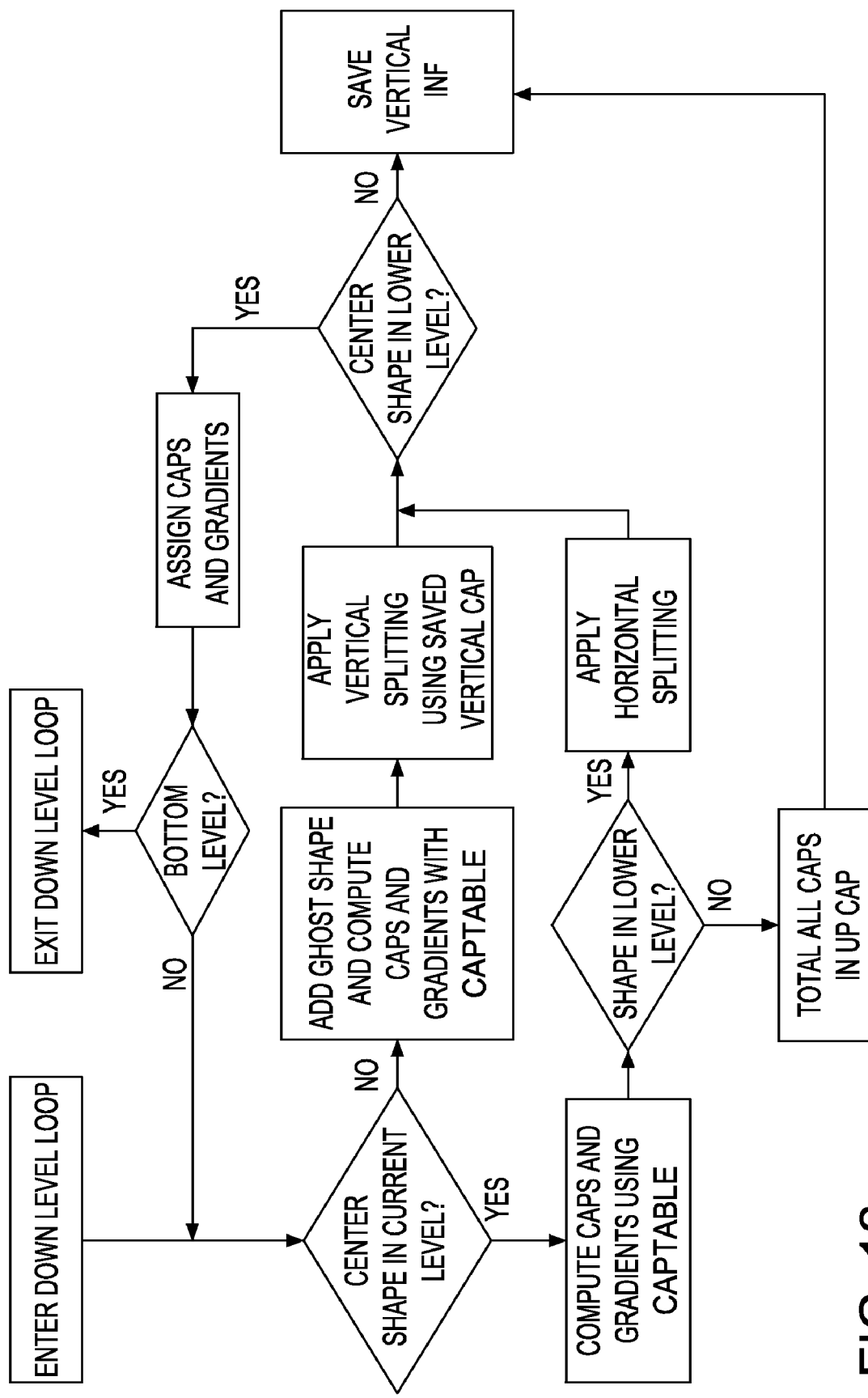
FIG. 12 is a flowchart showing the downward pass in the capacitance and gradient calculation engine.

FIG. 11 is a flowchart of the steps executed in the upward capacitance and gradient calculation pass, while FIG. 12 is a flowchart of the steps executed in the downward calculation pass. The sequence and nature of steps are similar in the two passes, and therefore only detailed description of FIG. 11 is provided.

Referring to FIG. 11, the capacitance and gradient calculation in the upward pass consists in checking whether the current level under consideration has indeed a physical shape to be processed (11.2). As evident from the descriptions of FIGS. 3a through 3e, a shape above a given target shape may or may not be present depending on the local configuration context. When a shape is present, the capacitance lookup table is accessed (11.3) to extract the capacitance and gradient information of that shape. The specific situation under which such information is available can be found with reference to the description of FIG. 13. Next, a test on the area data structure is performed to ascertain the presence of a shape anywhere in a level above a current level. If such a shape is present, an operation referred to "horizontal splitting" is applied. The operation consists in using a correction factor to adjust the capacitance and gradient values obtained from the capacitance lookup table. The specific situation under which such operation is performed is detailed in FIG. 14. If a shape in the upper level is not present, the capacitance and gradient values resulting from (11.3) are totaled (11.6) and saved for further processing (11.10). After applying a "horizontal splitting", an additional check for the presence of a center shape in the upper level is performed (11.9). If such a center shape is present, then capacitance and gradient values are assigned (11.11) to the target net in question. If it is not present, then again the result of the horizontal splitting is saved (11.10) for further processing. The sequence of operations (11.1, 11.2, 11.3, 11.4, 11.5, 11.9, 11.11) are triggered in case a center shape is present in the current level. If such a shape is not present, then an operation that consists in filling up the center region with a "ghost" shape is performed (11.7). The capacitance and gradient information of the ghost shape is obtained from the capacitance lookup table. It is followed by a step referred to as "vertical splitting" that consists in using a correction factor to adjust the capacitance and gradient values obtained in (11.7). The specific situation under which such operation is performed is detailed in FIG. 15. The upward capacitance calculation pass is exited (11.13) as soon as top level is reached.

The above upward pass is concerned with computing capacitance and gradients when looking up the layers above those of a target net. A similar downward pass is used to compute capacitance and gradients as one looks down to the layers below those of the target net (see FIG. 12). A detailed description of the flowchart shown in FIG. 12 can be readily inferred from FIG. 13.

As previously mentioned, there is a specific situation under which capacitances and gradients are readily available, as described with reference to FIG. 13. Therein, a shape pattern referred to a nested (or centered) wiring pattern is shown along with the header and a typical entry for the capacitance and gradient lookup table. In a preferred embodiment of the invention, the gradients included in the lookup table are computed with respect to the variables specified in the parameter abstraction of FIG. 8. To restrict the size of the lookup table, it is further assumed that the width of the centered wire corresponds to that of the minimum design rule width. Accordingly, the capacitance gradient with respect to width is computed at that minimum width. Because the configuration assumes that the centered wire be included between solid plates below and above, the gradients with respect to the width of the wire above the target net and the width of the wire below the target net are not included in the capacitance table. They will be inferred from the upward and downward passes, as explained in FIGS. 14 and 15. Keys to the rows of the lookup table are made of the indices of the lower layer, the target net layer, and the upper layer. Another component of the key is the distance separating the target wire and its nearest neighbor. The capacitance columns in the lookup table contain different capacitance components, such as lateral capacitance, and upward and downward capacitance. The gradient columns contain the gradients of each of these capacitance components with respect to the abstracted parameters. One distinct advantage of the present invention is the reduction in the size of the lookup table because of the use of abstracted parameters rather than the original variables. The use of lateral, upward, and downward capacitance is for meant only for illustration as other types of capacitance can be used. Such other types include fringing capacitance, parallel-plate capacitance, and total capacitance. From an electrical analysis viewpoint, the most useful capacitance types are the total net capacitance and the net-to-net coupling capacitance. (Note: a net is a set of electrically connected shapes in the chip layout). The net-to-net coupling capacitance results from the electrostatic interaction between the shapes of a given net and the shapes of another net that is not in electrical contact with the first net. The total capacitance of a target net consists of the sum of all the net-to-net coupling capacitances between the target net and all the other nets that are in its proximity.

FIG. 14 is an illustration of the "horizontal splitting" algorithm used to address the case when the area configuration pattern deviates from that of the capacitance lookup table. More specifically, FIG. 14 shows an instance under which the "horizontal splitting" operation in FIGS. 11 and 12 is used. The present case occurs when it is assumed a solid plate of the centered shape pattern of FIG. 13. Correction factors have to be applied to the capacitances accessed from the capacitance table in order to accommodate the fact that shapes below or above the shapes of the target net are not solid plates but rather disconnected shapes. U.S. Pat. No. 5,838,582 to Mehrorta et al. describes how to apply correction factors in the case of nominal capacitance calculation. In the present invention, correction factors are preferably also applied to the gradients of the capacitances. These corrections factors are explicitly given in the detailed explanation of FIG. 16. In a preferred embodiment of the invention, the table lookup gradients of upper layer of FIG. 14 are used to modify the table lookup gradients of the target layer. The modification is operated through the gradients of the correction factors used in the nominal capacitance calculation. An advantage of the present invention is that the vertical abstracted parameters are employed to compute the gradients of both the target and upper layers. When a gradient with respect to the horizontal abstracted parameters is sought, two possibilities can be contemplated. One possibility is to use the same width in both the upper layer and target layer. This is illustrated with the two dashed lines showing the symmetric, equal width perturbation of both layers. Another possibility is to let the upper width change independently of target width.

FIG. 15 shows the case under which the "vertical splitting" operation in FIGS. 11 and 12 is used, and occurs when the center region above or below a target shape has no shape. A "ghost" shape is created and its capacitances values are obtained from the lookup table. These capacitances are then used as a basis of adjusting the capacitances of the target shape. The adjustment consists in applying correction factors to the capacitances of the target shape. U.S. Pat. No. 5,838, 582, previously mentioned, describes how to compute the correction factors based on ghost shapes for the case of nominal capacitance computation. In an embodiment of the present invention, correction factors are also applied to the gradients of the capacitances. These corrections factors are explicitly given in the detailed explanation of FIG. 16. The table lookup gradients of ghost shape of FIG. 15 are preferably employed to modify the table lookup gradients of the target layer. The modification is operated through the gradients of the correction factors of used in the nominal capacitance calculation. An advantage of the present invention is that the vertical abstracted parameters can be used to compute the gradients of both the target and ghost shapes. When a gradient with respect to the horizontal abstracted parameters is sought, two possibilities can be contemplated. One possibility is to use the same width in both the ghost shape and target shape. This is illustrated by way of the two dashed lines showing the symmetric, equal width perturbation for both layers. Another possibility is to let the upper width change independently of the target width.

Figure 16:
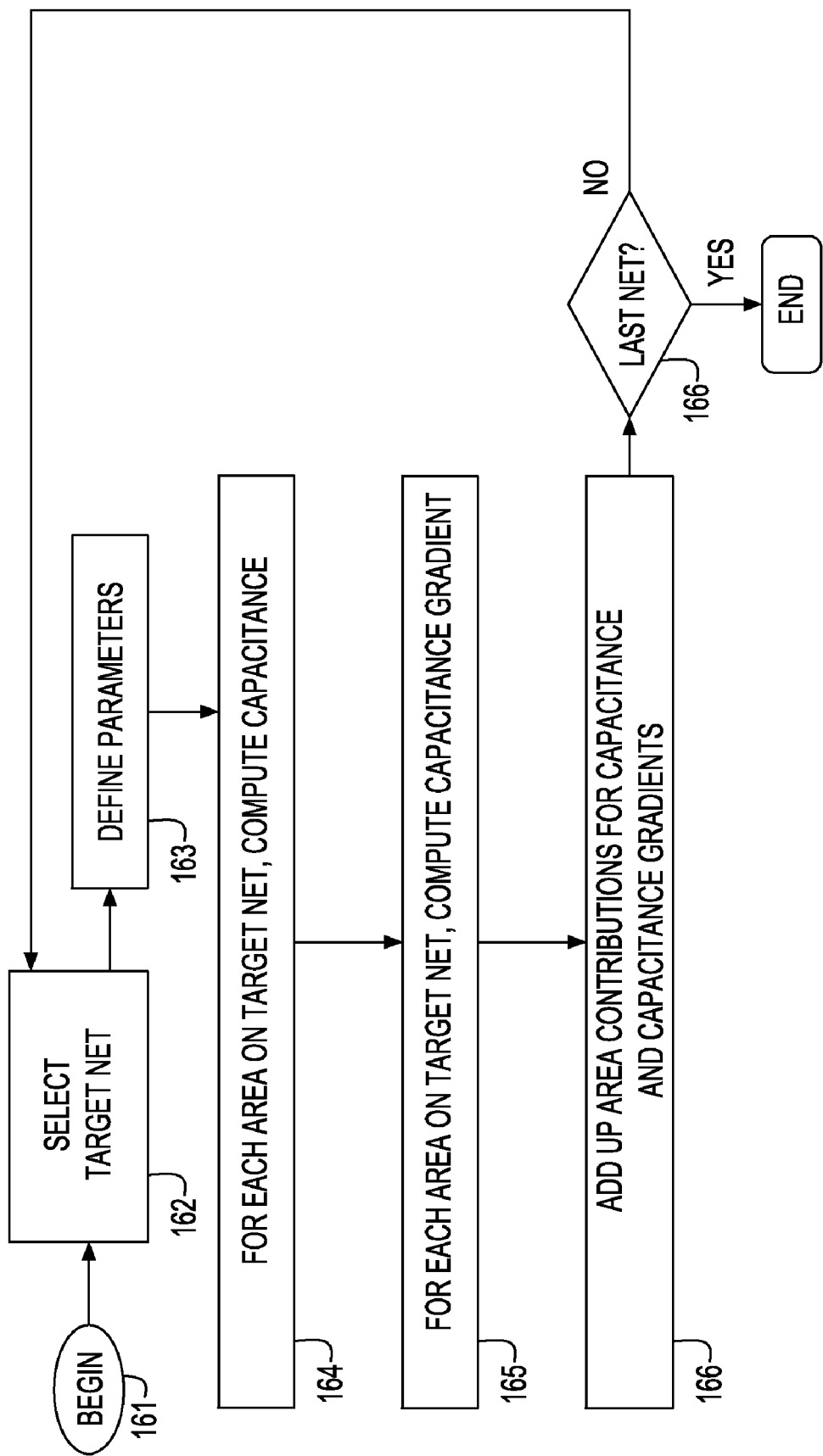
FIG. 16 is a flowchart of an embodiment of the invention showing table lookup capacitances and algorithmic capacitances and gradients combined to create a net-to-net capacitance and capacitance gradients.

According to one preferred embodiment of the invention, the sequence of steps to compute the gradients of a given target net are shown in FIG. 16. A target net is first selected (16.2). Then the variational parameters for that net are defined (16.3), i.e., the parameters with respect to which net capacitance gradients are computed. According to an embodiment of the invention (FIG. 7), these parameters are the horizontal width parameters ($\overline{W}$) and the vertical thickness parameters ($\overline{T}$). For each area on the target net, the area capacitance (16.4) is computed according to the upward (FIG. 11) and downward pass (FIG. 12). The computation can be condensed into the formula $$C_{area} = C_{Table}(\overline{W}, \overline{T}) \times f(\overline{W}, \overline{T}) \quad (1)$$

where $C_{area}$ is the capacitance of the area under consideration. Note that the capacitance is derived from two sources: the capacitance lookup table $C_{Table}(\overline{W}, \overline{T})$ and the correction factor $f(\overline{W}, \overline{T})$ that result from the area configuration deviating from the elementary pattern of the capacitance table. The gradient calculation with respect to the parameters is performed according to (16.5) using the following equation $$\frac{dC_{area}}{dP} = \frac{dC_{Table}(\overline{W}, \overline{T})}{dP} \times f(\overline{W}, \overline{T}) + C_{Table}(\overline{W}, \overline{T}) \times \frac{df(\overline{W}, \overline{T})}{dP} \quad (2)$$

where P is the parameter vector with respect to which the gradient is being taken, $$\frac{dC_{area}}{dP}$$

is the gradients of the area capacitance. The first term on the right-hand-side in the above equation provides the gradients of the capacitance as obtained from the capacitance lookup table corrected by the same factors used to correct the nominal capacitance. The second term provides the contribution of the correction factor gradients to the capacitance gradients. Note that the correction factors and analytical or semi-analytical expressions whose gradients can be computed explicitly according to the well-know rules of differentiation. Moreover, the target net is made of a set of areas to which the contributions of all capacitances and gradients of the target net areas are added to obtain the net capacitance and gradients. The calculation terminates as soon as the last net is processed.

One aspect of the invention relates the multipliers assigned to the area virtual edges by the shape processing engine (FIGS. 8 and 9) to the capacitance gradients computed in the flowchart of FIG. 16. The mathematical relationship is given by $$\frac{dC_{Table}(\overline{W}, \overline{T})}{dP} = \sum_v m_v \frac{\partial C_{Table}(\overline{v})}{\partial v} \quad (3)$$

$$\frac{df(\overline{W}, \overline{T})}{dP} = \sum_v m_v \frac{\partial f(\overline{v})}{\partial v} \quad (4)$$

where the gradients $$\frac{dC_{table}}{dP}, \frac{df}{dP}$$

are calculated using equation (2). The partial derivatives $$\frac{\partial C_{Table}}{\partial v}, \frac{\partial f}{\partial v}$$

are, respectively, those of the table lookup capacitance and the correction factor with respect to an edge location v. The symbol $\overline{v}$ denotes the vector of all the edge locations of the area under consideration. The symbol $m_v$, denotes the multiplier assigned to the edge v (an edge is identified with its location). As previously explained, this step is needed to accommodate the fact that horizontal parameters are physical widths while areas are defined by both physical and virtual edges. According to equations (3) and (4), the gradient contributions of lookup tables and correction factors are linear combinations of edge-based gradients, the coefficients of the linear combination being provided by the area edge multiplier.

It should be noted that although not explicitly specified, one or more steps of the methods described herein may include a storing, displaying and/or outputting step as required for a particular application. Any data, records, fields, and/or intermediate results previously described can be stored, displayed, and/or outputted to another device, as required for a particular application. Furthermore, steps or blocks in the accompanying figures that recite a determining operation or involve a decision, do not necessarily require that both branches of the determining operation be practiced. Alternatively, one of the branches of the determining operation can be deemed as an optional step.

The present invention can be realized in hardware, software, or a combination of hardware and software. The present invention can be realized in a centralized fashion in one computer system or in a distributed fashion where different elements are spread across several interconnected computer systems. Any kind of computer system—or other apparatus adapted for carrying out the methods described herein—is suitable. A typical combination of hardware and software could be a general purpose computer system with a computer program that, when being loaded and executed, controls the computer system such that it carries out the methods described herein.

The present invention can also be embedded in a computer program product, which comprises all the features enabling the implementation of the methods described herein, and which—when loaded in a computer system—is able to carry out the methods.

Computer program means or computer program in the present context mean any expression, in any language, code or notation, of a set of instructions intended to cause a system having an information processing capability to perform a particular function either directly or after conversion to another language, code or notation and/or reproduction in a different material form.

While the present invention has been particularly described in conjunction of a simple illustrative embodiment, it is to be understood that one of ordinary skill in the art can extend and apply the invention in many obvious ways. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention.

What is claimed is:

1. A method for determining capacitance gradients of a Very Large Integrated Circuit (VLSI) chip layout, comprising:
   i. using a computer, decomposing one or more layout shapes into elementary patterns;
   ii. translating physical parameter variations into variations on parameters of elementary patterns into which the layout shapes are decomposed;
   iii. computing capacitance gradients of said elementary patterns using a lookup table;
   iv. combining said capacitance gradients into capacitance gradients of said one or more layout shapes of said chip layout;
   v. transferring said capacitance gradients to a netlist providing electrical-level descriptions of said chip layout; and
   vi. translating physical parameter variations into variations on edges of elementary patterns into which said chip layout shapes are decomposed, and mapping layout patterns into layout configurations extracted from said look out tables.

2. The method as recited in claim 1, further comprising computing said capacitance gradients by extracting capacitance gradient values stored in said lookup table.

3. The method as recited in claim 1, wherein said capacitance gradients are determined from analytical expressions of capacitance correction factors.

4. The method as recited in claim 1 wherein said capacitance gradients are computed for net-to-net capacitances, lateral, fringing, or up and down capacitances.

5. A method for determining capacitance gradients of a Very Large Integrated Circuit (VLSI) chip layout, comprising:
  i. using a computer, decomposing one or more layout shapes into elementary patterns;
  ii. translating physical parameter variations into variations on parameters of elementary patterns into which the layout shapes are decomposed;
  iii. computing capacitance gradients of said elementary patterns using a lookup table;
  iv. combining said capacitance gradients into capacitance gradients of said one or more layout shapes of said chip layout;
  v. transferring said capacitance gradients to a netlist providing electrical-level descriptions of said chip layout;
  vi. projecting physical edges of shapes of source nets onto shapes of a target net;
  vii. using said projected physical edges to decompose the target shapes into areas; and
  viii. defining neighbors for each of said areas.

6. The method as recited in claim 5 wherein boundaries of said areas comprise virtual and physical edges.

7. The method as recited in claim 6 wherein variations of said virtual edges are determined in accordance with an edge change array.

8. The method as recited in claim 7 wherein said edge change array is transformed into a multiplier array.

9. The method as recited in claim 8 wherein said transforming said multiplier array further comprises:
  a. determining an impact of changes in said physical edges of shapes of source nets on the same layer as the shapes target net;
  b. determining the impact of the changes in said physical edges of the shapes of said source nets immediately below said shapes of said target net; and
  c. determining the impact of the changes in said physical edges of the shapes of said source nets immediately above said shapes of said target net.

10. The method as recited in 9 wherein said multiplier array increases in size by including the impact of changes of said physical edges of said shapes of said source nets that are more than one layer below or above said shapes of said target net.

11. The method as recited in 9 wherein values are assigned to each component of said multiplier array with reference to a global orientation in a horizontal plane of said target shape.

12. The method as recited in claim 5, further comprising ascertaining a presence of a shape in a level above a current level, and if said shape is present, performing a horizontal split using a correction factor to adjust the capacitance gradients obtained from said lookup table.

13. The method as recited in claim 12 wherein if said shape in said level above said current level is absent, said capacitance gradients are totaled.

14. The method as recited in claim 12 wherein after performing said horizontal splitting, determining the presence of a center shape in said level above said current level.

15. The method as recited in claim 14 wherein vertical splitting is performed using a correction factor to adjust the capacitance gradients.

16. The method as recited in claim 12 wherein in absence of said shape in said level above said current level, a center region is filled with a ghost shape whose capacitance gradient information is determined from the lookup table.

17. The method as recited in claim 12, further comprising computing capacitance gradients of elementary patterns with respect to width variations using a weighted sum of capacitance gradients with respect to edge variations, said weights being defined by edge multipliers.

18. The method as recited in claim 17, further comprising computing capacitance gradients of a target net using said capacitance gradients of said elementary patterns.

19. A program storage device readable by a machine, tangibly embodying a program of instructions executable by the machine to perform method steps to determine capacitance gradients of a Very Large Integrated Circuit (VLSI) chip layout, the method comprising:
  i. using a computer, decomposing one or more layout shapes into elementary patterns;
  ii. translating physical parameter variations into variations on parameters of elementary patterns into which the layout shapes are decomposed;
  iii. computing capacitance gradients of said elementary patterns employing a lookup table;
  iv. combining said capacitance gradients into capacitance gradients of said one or more layout shapes of said chip layout;
  v. transferring said capacitance gradients to a netlist providing electrical-level descriptions of said chip layout; and
  vi. translating physical parameter variations into variations on edges of elementary patterns into which said chip layout shapes are decomposed, and mapping layout patterns into layout configurations extracted from said look out tables.

* * * * *